(12) United States Patent
Ishii et al.

(10) Patent No.: US 9,634,167 B2
(45) Date of Patent: Apr. 25, 2017

(54) SOLAR CELL MODULE

(71) Applicant: Panasonic Intellectual Property Management Co., Ltd., Osaka-shi, Osaka (JP)

(72) Inventors: Yousuke Ishii, Osaka (JP); Keiichi Kuramoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/795,956

(22) Filed: Jul. 10, 2015

(65) Prior Publication Data

US 2015/0318422 A1 Nov. 5, 2015

Related U.S. Application Data

(63) Continuation of application No. PCT/JP2014/000009, filed on Jan. 6, 2014.

(30) Foreign Application Priority Data

Jan. 10, 2013 (JP) .................................. 2013-003010

(51) Int. Cl.
*H01L 31/00* (2006.01)
*H01L 31/042* (2014.01)
(Continued)

(52) U.S. Cl.
CPC ............ *H01L 31/048* (2013.01); *B60K 16/00* (2013.01); *H01L 31/0352* (2013.01);
(Continued)

(58) Field of Classification Search
CPC ... H01L 31/048; H01L 31/05; H01L 31/0465; H01L 31/0352; Y02E 10/50; B60K 2016/003
(Continued)

(56) References Cited

U.S. PATENT DOCUMENTS 6,291,761 B1* 9/2001 Takada .............. H01L 31/03529
136/244
2009/0272841 A1* 11/2009 Sinsabaugh ............... B64B 1/14
244/30
(Continued)

FOREIGN PATENT DOCUMENTS

JP S60201667 A 10/1985
JP H01196181 A 8/1989
(Continued)

OTHER PUBLICATIONS

International Search Report corresponding to Application No. PCT/JP2014/000009; Date of Mailing: Jan. 28, 2014, with English translation.

*Primary Examiner* — Lindsey Bernier
(74) *Attorney, Agent, or Firm* — Cantor Colburn LLP

(57) ABSTRACT

A solar cell module comprising: a first protective member having a curved surface having a prescribed radius of curvature set in at least a first direction; a first filling material arranged upon the first protective member; a plurality of solar cell strings arranged in the first direction upon the first filling material and connected in parallel to each other; a second filling material arranged upon the solar cell strings; and a second protective member arranged upon the second filling material. The solar cell strings have connected in series a plurality of solar cells that are arranged in a second direction. The solar cells have end cross-sections along at least the first direction that have a waveform shape.

3 Claims, 6 Drawing Sheets

(51) Int. Cl.
    *H02N 6/00*      (2006.01)
    *H01L 31/048*    (2014.01)
    *H01L 31/0465*   (2014.01)
    *H01L 31/05*     (2014.01)
    *H01L 31/0352*   (2006.01)
    *B60K 16/00*     (2006.01)

(52) U.S. Cl.
    CPC .......... *H01L 31/0465* (2014.12); *H01L 31/05* (2013.01); *B32B 2457/12* (2013.01); *B60K 2016/003* (2013.01); *Y02E 10/50* (2013.01)

(58) Field of Classification Search
    USPC ................ 136/244, 245, 251, 252, 256, 259
    See application file for complete search history.

(56) References Cited

U.S. PATENT DOCUMENTS

| | | | |
|---|---|---|---|
| 2010/0229923 A1* | 9/2010 | Frolov | ............... H01L 31/0392 136/251 |
| 2011/0277814 A1 | 11/2011 | Kyoda et al. | |
| 2011/0290299 A1 | 12/2011 | Kyoda et al. | |

FOREIGN PATENT DOCUMENTS

| | | |
|---|---|---|
| JP | H0992867 A | 4/1997 |
| WO | 2010087460 A1 | 8/2010 |

* cited by examiner

SOLAR CELL MODULE

CROSS-REFERENCE TO RELATED APPLICATION

The present application is a continuation under 35 U.S.C. §120 of PCT/JP2014/000009, filed Jan. 6, 2014, which is incorporated herein by reference and which claimed priority to Japanese Patent Application No. 2013-003010 filed Jan. 10, 2013. The present application likewise claims priority under 35 U.S.C. §119 to Japanese Patent Application No. 2013-003010 filed Jan. 10, 2013, the entire content of which is also incorporated herein by reference.

TECHNICAL FIELD

The present invention relates to a solar cell module, and more particular to a solar cell module having a curved surface.

BACKGROUND ART

To provide a vehicle etc. with a solar cell module, it is desirable that the solar cell module has a curved surface corresponding to a three-dimensional shape of a body of the vehicle.

For example, Patent Literature 1 describes a solar cell module mounted on a vehicle such as an automobile which has a curved-surface structure corresponding to a roof shape of the automobile. Patent Literature 1 points out that when a solar cell element is bent beyond a certain radius of curvature, a crack may occur on the solar cell element in consideration of a bending strength of the solar cell element.

CITATION LIST

Patent Literature

Patent Literature 1: Japanese Patent Laid-Open Publication No. Hei 1-196181

SUMMARY OF INVENTION

Technical Problem

In a solar cell module having a curved surface, there is a need to suppress cracking of a solar cell.

Solution to Problem

A solar cell module of the present invention comprises: a first protective member having a curved surface with a prescribed radius of curvature set in at least a first direction, a first filling material arranged upon the first protective member; a solar cell arranged upon the first filling material; a second filling material arranged upon the solar cell; and a second protective member arranged upon the second filling material, and in the solar cell, at an end at least in a second direction that is orthogonal to the first direction, an end cross-section along the first direction has a waveform shape.

Advantageous Effect of Invention

The present invention can suppress cracking of a solar cell in a solar cell module having a curved surface.

DESCRIPTION OF EMBODIMENTS

Figure 1:
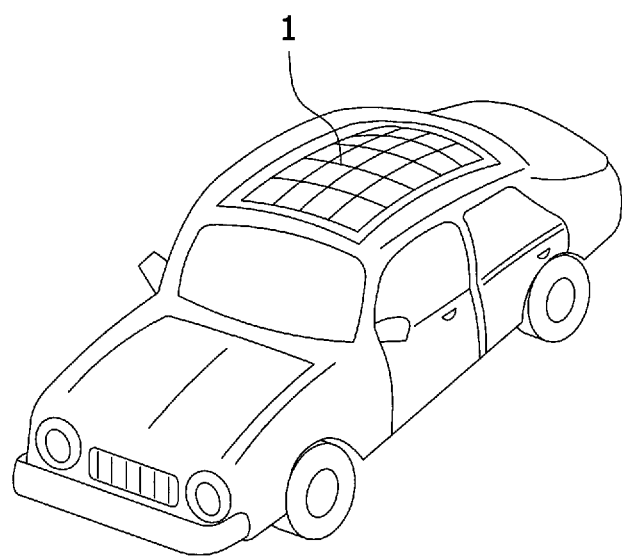
FIG. 1 is a view illustrating a vehicle on which a solar cell module of an embodiment of the present invention is mounted.

Hereinafter, detailed descriptions will be given of an embodiment of the present invention with reference to the drawings. The material, the thickness, the size, the number of solar cells and the like herein, which are just an example for explanation, may be modified as appropriate based on a specification of a solar cell module. In the following descriptions, corresponding components are denoted by the same reference characters throughout the drawings and overlapping description thereof is omitted.

(Configuration of Solar Cell Module 1)

Figure 2:
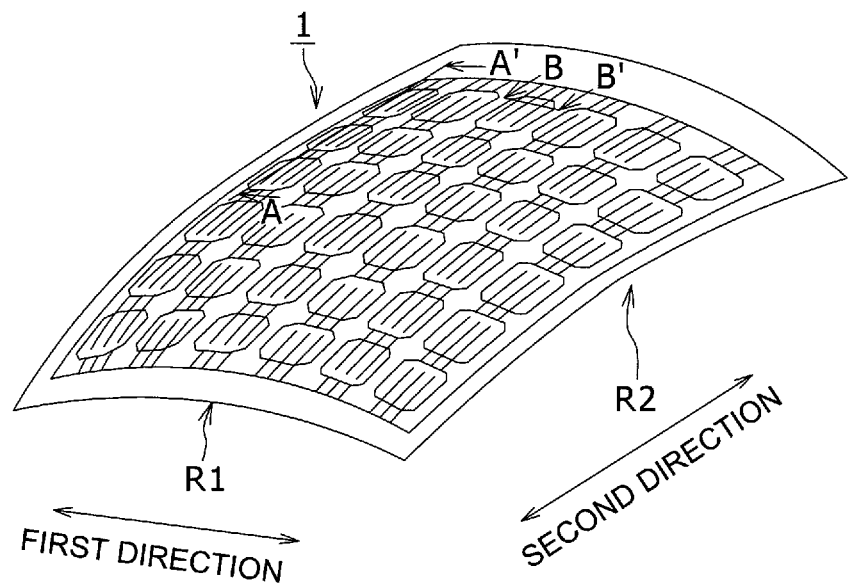
FIG. 2 is a perspective view of the solar cell module in the embodiment of the present invention.
Figure 3:
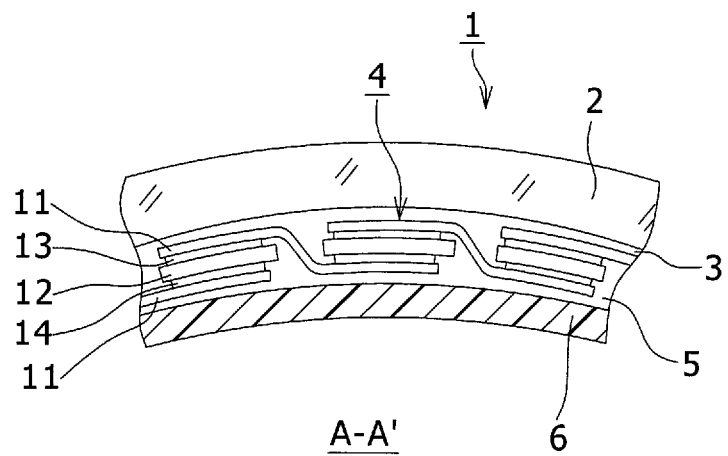
FIG. 3 is a cross section taken along the line A-A' in FIG. 2, viewed in an arrow direction.

FIG. 1 illustrates a vehicle including a solar cell module 1. FIG. 2 is a perspective view of the solar cell module 1. FIG. 3 is a cross section taken along the line A-A' in FIG. 2, viewed in an arrow direction. Hereinafter, a vehicle width direction is referred to as a first direction, and a longitudinal direction as a second direction.

The solar cell module 1 includes a first protective member 2, a first filling material 3, a plurality of solar cell strings 4, a second filling material 5 and a second protective member 6, in this order. The solar cell module 1 has a two-dimensionally or three-dimensionally curved surface shape in conformity with an outer shape of a roof of a vehicle body. The solar cell module 1 is curved from the inside of the vehicle body toward the outside. The first protective member 2 is a protective member at a light-receiving surface side. The second protective member 6 is a protective member at a back surface side.

The first protective member 2 has a prescribed radius of curvature R1 set in at least a first direction in conformity with a curved surface shape of the roof of the vehicle body. The first protective member 2 may further have a prescribed radius of curvature R2 in a second direction. The radius of curvature R1 in the first direction here is smaller than the radius of curvature R2 in the second direction. The first protective member 2 is a transparent plate or film through which light can be received from outside. As the first protective member 2, a transparent member such as a glass plate, a resin plate, and a resin film etc. can be used.

The first filling material 3 is a sheet member having functions, for example, to serve as an impact buffering member for the solar cell strings 4 and to prevent a contaminant, a foreign substance, water or the like from entering the solar cell strings 4. The material of the first filling material 3 is selected with consideration of heat resistance, adhesiveness, flexibility, molding capability, and durability etc. To receive light from the outside, a transparent filling material that has as high colorlessness and transparency as possible and transmits incident light without absorbing or reflecting the light is used for the first filling material 3. For example, a polyethylene olefin resin or ethylene-vinyl acetate (EVA) is used. EEA, PVB, a silicone resin, a urethane resin, an acrylic resin, and an epoxy resin can also be used, in addition to EVA.

The configuration of the solar cell string 4 will be described later.

The second filling material 5 is a sheet member having the same function as the first filling material 3. For the second filling material 5, a filling material having the same configuration as the first filling material 3 may be used, or a colored filling material may be used to have appropriate reflectivity. As the colored filling material having appropriate reflectivity, a filling material obtained by adding inorganic pigment such as titanium oxide or zinc oxide as an additive for white coloring to such a colorless and transparent filling material as above can be used.

The second protective member 6 is an opaque plate or film. For example, a laminated film such as a resin film containing aluminum foil may be used. A colorless and transparent sheet may be also used for the second protective member 6.

(Configuration of Solar Cell String 4)

The solar cell module 1 is arranged in the first direction, and includes the plurality of solar cell strings 4 connected in parallel with each other. In the solar cell string 4, a plurality of solar cells 10 arranged in the second direction are connected in series by connection members 11. The respective solar cell strings 4 are curved in conformity with the shape of the first protective member 2.

The solar cell 10 includes a photoelectric converter 12, a light-receiving surface collecting electrode 13 and a back surface collecting electrode 14.

The photoelectric converter 12 generates light generating carriers, or holes and electrons, by receiving light such as sun light. The photoelectric converter 12 has a substrate formed of a semiconductor material such as crystalline silicon (c-Si), gallium arsenide (GaAs) and indium phosphide (InP). A structure of the photoelectric converter is a p-n junction in a broad sense. For example, a heterojunction of an n-type single crystal silicon substrate and amorphous silicon may be used. In this case, a double-sided power generation type structure can be used in which an i-type amorphous silicon layer, a p-type amorphous silicon layer doped with e.g., boron (B), and a transparent conductive film (TCO) formed of transparent conductive oxide of indium oxide ($In_2O_3$) are laminated on the light-receiving surface side of the substrate, while an i-type amorphous silicon layer, an n-type amorphous silicon layer doped with e.g., phosphorous (P) and a transparent conductive film are laminated on the back surface side of the substrate.

The photoelectric converter 12 may have another structure as long as the photoelectric converter 12 has a function to convert light such as sun light to electricity. For example, there may be used a structure having a p-type polycrystalline silicon substrate, an n-type diffusion layer formed on the light-receiving surface side and an aluminum metal film formed on the back surface side.

The light-receiving surface collecting electrode 13 and the back surface collecting electrode 14, which are a connection electrode, are connected with the connection members 11. The single solar cell 10 has the three light-receiving surface collecting electrodes 13 on the light-receiving surface and the three back surface collecting electrodes 14 on the back surface side. The three light-receiving surface collecting electrodes 13 are aligned in the first direction and extended in the second direction. The same applies to the back surface collecting electrodes 14. The light-receiving surface collecting electrode 13 and the back surface collecting electrode 14 each preferably have a width of 1.5 mm to 3 mm approximately and a thickness of 20 µm to 160 µm approximately. On each of the light-receiving surface and the back surface of the solar cell 10, a plurality of finger electrodes that are orthogonal to the light-receiving surface collecting electrodes 13 and the back surface collecting electrodes 14, respectively, may be formed. The finger electrodes are electrically connected with the light-receiving surface collecting electrodes 13 and the back surface collecting electrodes 14.

The connection member 11 is a conductive member connecting the adjacent solar cells 10 with each other. The connection member 11 is connected with the three light-receiving surface collecting electrodes 13 on the light-receiving surface of one solar cell 10 of the adjacent solar cells 10, and also connected with the three back surface collecting electrodes 14 on the back surface of the other solar cell 10. The connection member 11 is connected with the light-receiving surface collecting electrodes 13 or the back surface collecting electrodes 14 via an adhesive. The width of the connection member 11 is set to be equal to or slightly larger than those of the light-receiving surface collecting electrode 13 and the back surface collecting electrode 14. As the connection member 11, a thin plate formed of a metal conductive material such as copper may be used. A stranded wire may also be used in place of such a thin plate. In addition to copper, silver, aluminum, nickel, tin, gold or an alloy of these metals may be used as the conductive material.

As the adhesive, a thermosetting resin adhesive of, e.g., an acrylic, highly flexible polyurethane or epoxy base can be used. The adhesive contains conductive particles. As the conductive particle, nickel, silver, gold-coated nickel, tin-plated copper and the like can be used. As the adhesive, an insulating resin adhesive can be also used. For example, In regard to the light-receiving surface of the solar cell 10, one of the surface of the connection member 11 and the surface of the light-receiving surface collecting electrode 13 which face each other or both of the surfaces are made uneven. The resin is appropriately excluded from a portion between the connection member 11 and the light-receiving surface collecting electrode 13. Thus, electrical connection is achieved.

(Shape of Solar cell)

Figure 4:
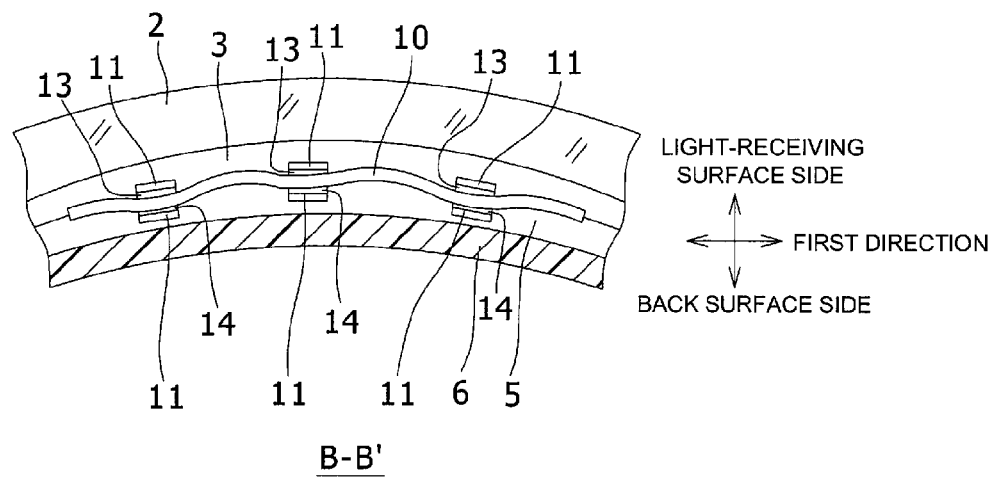
FIG. 4 is a cross section taken along the line B-B' in FIG. 2, viewed in an arrow direction.
Figure 5:
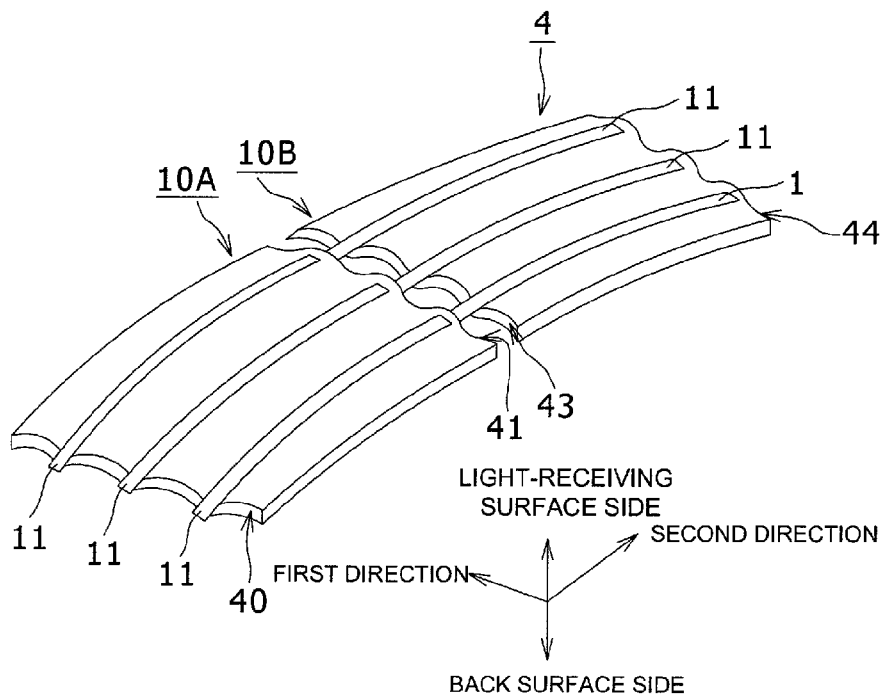
FIG. 5 is a perspective view of part of a solar cell string in the embodiment of the present invention.

FIG. 4 is a cross section taken along the line B-B' in FIG. 2, viewed in an arrow direction. The cross section taken along the line B-B' in FIG. 2 is a section of the end of the solar cell 10 in the second direction and the section is taken along the first direction. FIG. 5 is a perspective view of solar cells 10A and 10B in the solar cell module 1, which are adjacent in the second direction.

The solar cells 10A and 10B are curved as a whole in conformity with the shape of the first protective member 2, as illustrated in FIG. 4 and FIG. 5. At each end of the solar cells 10A and 10B in the second direction, end cross-sections 40, 41, 43 and 44 are formed to have a waveform shape along the first direction. More specifically, on the end cross-section 40 of the solar cell 10A, a position where the connection member 11 is arranged has a concave (valley) that is curved from the light-receiving surface side toward the back surface side, and a position between the adjacent connection members 11 has a convex (peak) that is curved from the back surface side toward the light-receiving surface side. On the end cross-section 41 of the solar cell 10A, a position where the connection member 11 is arranged has a convex that is curved from the back surface side toward the light-receiving surface side, and a position between the adjacent connection members 11 has a concave that is curved from the light-receiving surface side toward the back surface side. That is, in the solar cell 10A, the concave position and the convex position are reversed between on one end and on the other end in the second direction.

The solar cell 10B has the same structure as the solar cell 10A. More specifically, the end cross-section 43 of the solar cell 10B has the same structure as the end cross-section 40 of the solar cell 10A. The end cross-section 44 of the solar cell 10B has the same structure as the end cross-section 41 of the solar cell 10A.

The waveform shapes of the solar cells 10A and 10B are formed since the respective solar cells 10A and 10B are curved in the second direction from the light-receiving surface side toward the back surface side or the back surface side toward the light-receiving surface side. The curvedness is small in the vicinity of the center part of the solar cells 10A and 10B in the second direction, and is large at the ends in the second direction.

The connection member 11 connects the back surface collecting electrode 14 of the solar cell 10A with the light-receiving surface collecting electrode 13 of the solar cell 10B. That is, between the solar cells 10A and 10B, the connection member 11 extends from the back surface side of solar cell 10A toward the light-receiving surface side of the solar cell 10B. In the end cross-section 41 of the solar cell 10A facing the solar cell 10B, a convex is formed at a position where the connection member 11 is arranged. In the end cross-section 44 of the solar cell 10B facing the solar cell 10A, a concave is formed at a position where the connection member 11 is arranged.

(Method of Manufacturing Solar Cell Module 1)

Figure 6:
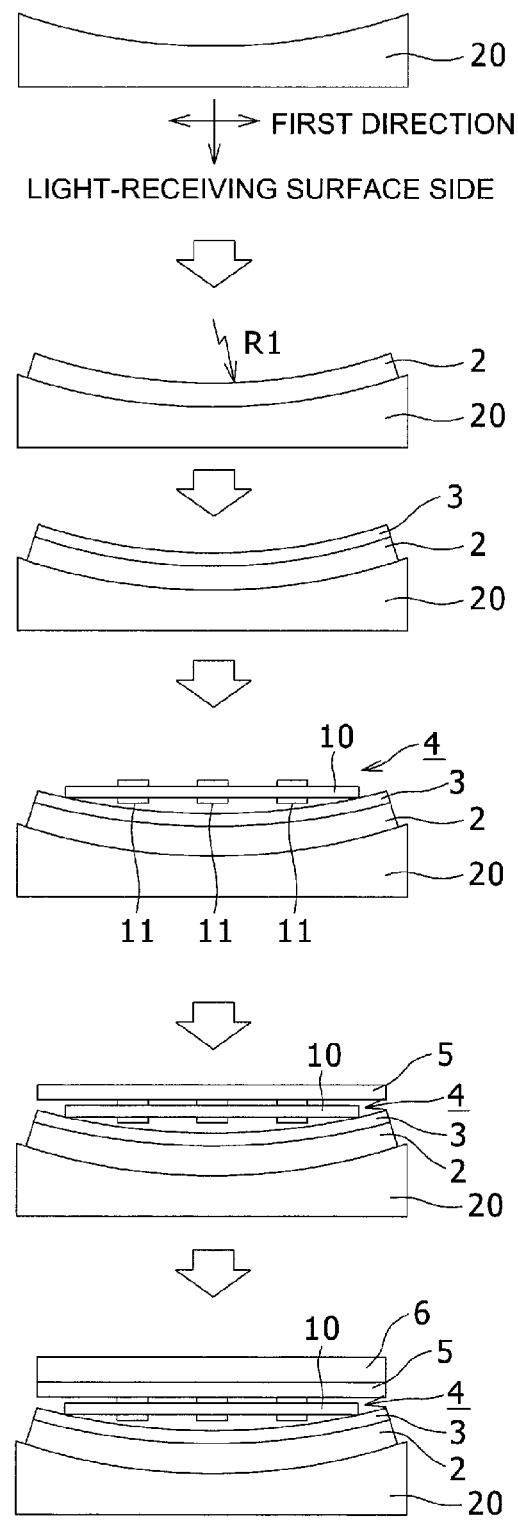
FIG. 6 is a cross section for illustrating a method of manufacturing the solar cell module in the embodiment of the present invention.
Figure 7:
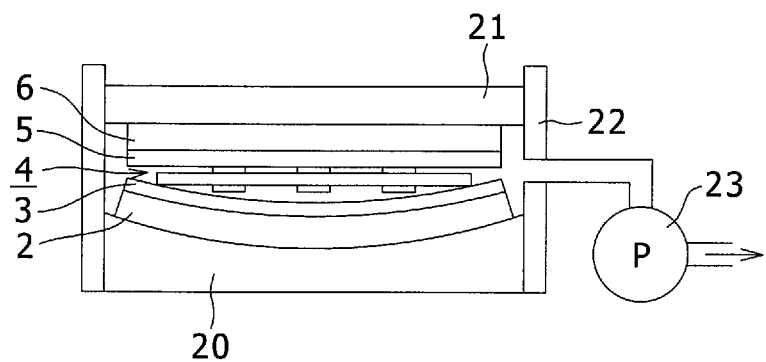
FIG. 7 illustrates pressure molding in the method of manufacturing the solar cell module in the embodiment of the present invention.
Figure 8:
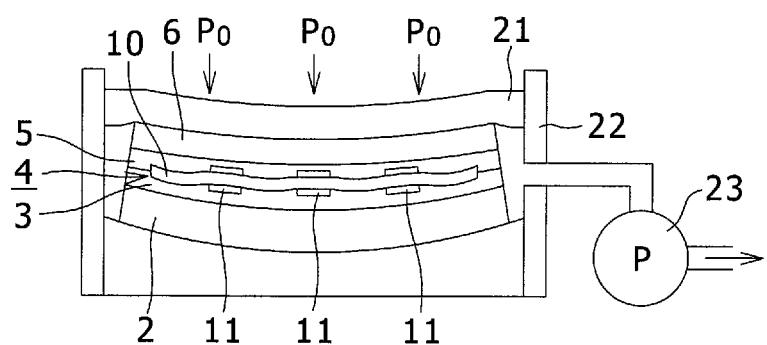
FIG. 8 illustrates members which are deformed or curved, in conformity with a curved surface of a first protective member, by the pressure molding in FIG. 7.

The method of manufacturing the solar cell module 1 will be described with reference to FIG. 6 to FIG. 10. FIG. 6 to FIG. 10 are a cross section of the solar cell module 1 along the first direction. Each lower side in the sheets of FIG. 6 to FIG. 10 is a light-receiving surface side. In FIG. 6 to FIG. 8, the solar cell module 1 includes the single solar cell string 4 for simple explanation. In FIG. 6 to FIG. 10, illustration of the light-receiving surface collecting electrode 13 and the back surface collecting electrode 14 is omitted.

As illustrated in FIG. 6, the first protective member 2, the first filling material 3, the solar cell string 4, the second filling material 5 and the second protective member 6 are laminated in this order on a base 20. The base 20 is a jig having a curved surface corresponding to the outer shape of the first protective member 2 which has a curved surface. After being laminated, the members other than the first protective member 2 are pressure-molded in conformity with the shape of the first protective member 2. Thus, at that time, the members other than the first protective member 2 are flat. However, since the first filling material 3 is a flexible sheet member, the first filling material 3 is arranged while being curved in conformity with the curved surface of the first protective member 2.

Next, the pressure molding is described with reference to FIG. 7 and FIG. 8. After the members are laminated on the base 20, an elastic body 21 for pressure molding is arranged on the second protective member 6. As the elastic body 21, an airtight rubber sheet etc. can be used. The laminated body and the elastic body 21 are housed in a frame 22 for pressure molding. The space between the base 20 and the elastic body 21 is decompressed by a decompressor 23. Accordingly, as illustrated in FIG. 8, the elastic body 21 is bent toward the light-receiving surface side by an atmospheric pressure $P_0$ to press the members to the first protective member 2 on the base 20. In the pressure molding, the members are deformed or curved in conformity with the curved surface of the first protective member 2. The elastic body 21 may be pressed directly to the light-receiving surface side without using the decompression method.

In the pressure molding, a predetermined part is heated to form any waveform shape of the solar cell 10. More specifically, a predetermined part of the first filling material 3 or the second filling material 5 is heated, and hardness of the filling material is adjusted. Thus, a concave-convex shape can be formed at any position. To heat the predetermined part of the first filling material 3, a heater may be provided inside the base 20. To heat the predetermined part of the second filling material 5, a heater may be provided inside the elastic body 21.

Figure 9:
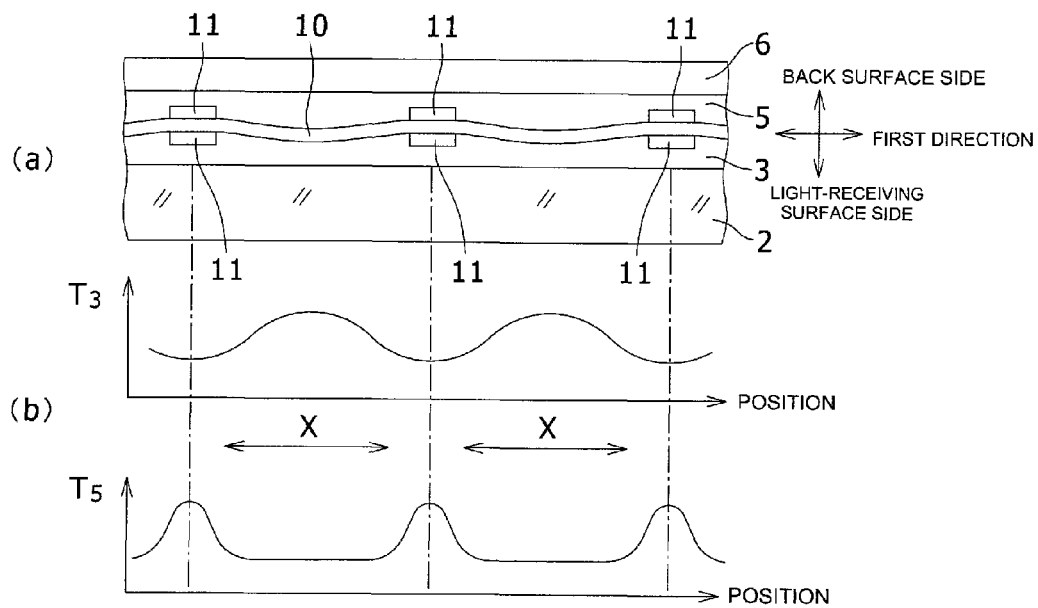
FIG. 9 illustrates a method of forming a waveform shape of a solar cell in the solar cell module in the embodiment of the present invention.
Figure 10:
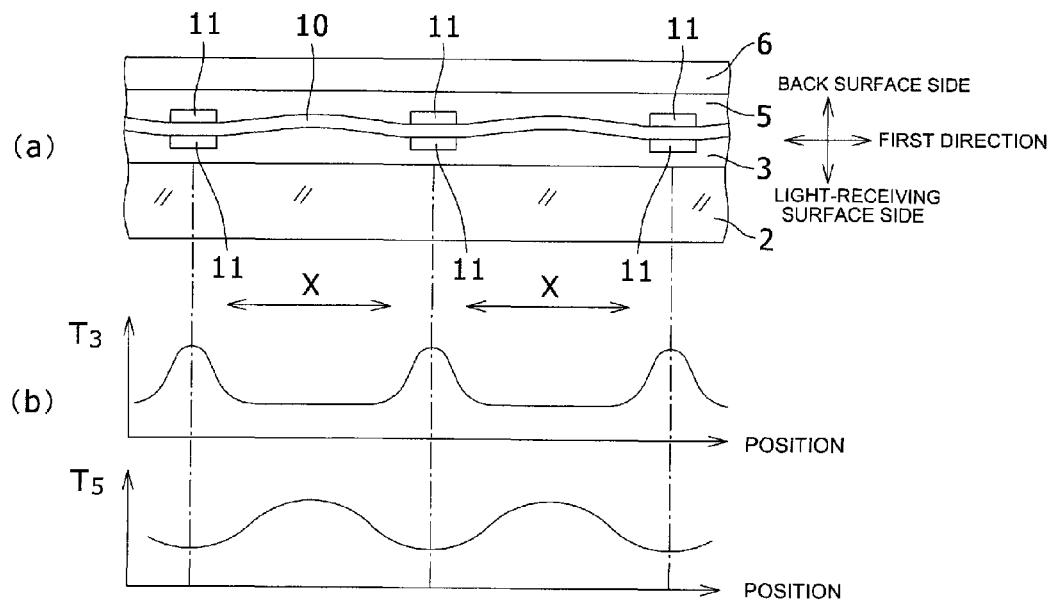
FIG. 10 illustrates a method of forming a waveform shape that has a reverse curve to that in FIG. 9.

A method of forming the waveform shapes is described with reference to FIG. 9 and FIG. 10. FIG. 9 illustrates a method of forming a waveform shape in which a position where the connection member 11 is arranged has a concave curved from the light-receiving surface side toward the back surface side, while a position between the adjacent connection members 11 has a convex curved from the back surface side toward the light-receiving surface side. On the contrary, FIG. 10 illustrates a method of forming a waveform shape in which a position where the connection member 11 is arranged has a convex curved from the back surface side toward the light-receiving surface side, while a position between the adjacent connection members 11 has a concave curved from the light-receiving surface side toward the back surface side. In each of FIG. 9 and FIG. 10, (a) illustrates a section of the solar cell module 1 along the first direction while (b) illustrates temperatures T3 and T5 at positions of the first filling material 3 and the second filling material 5, respectively, along the first direction. In FIG. 9(a) and FIG. 10(a), curves of the members are omitted for simple explanation.

To form the waveform shape illustrated in FIG. 9, as illustrated at the upper part in FIG. 9(b), the temperature T3 of the first filling material 3 between the adjacent connection members 11 is made higher than those of the other parts. The higher temperature T3 can be achieved by using the base 20 which includes the plurality of heaters extending along the second direction at the position corresponding to the space between the adjacent connection members 11. Accordingly, the hardness of the first filling material 3 between the adjacent connection members 11 is lowered to facilitate deformation. At that time, the hardness of the second filling material 5 is adjusted to be higher than the hardness of the first filling material 3 between the adjacent connection members 11.

When the pressure molding is performed in such a state, an area X between the adjustment connection members 11 of the solar cell 10 is curved from the back surface side toward the light-receiving surface side. More specifically, the elastic body 21 presses the members to the first protective member 2, and thus, the first filling material 3, the solar cell strings 4, the second filling material 5 and the second protective member 6 are curved in conformity with the shape of the first protective member 2. The hardness of the first filling material 3 between the connection members 11 is lower than the hardness of the first filling material 3 in the vicinity of the connection member 11. Thus, by being pressed by the elastic body 21, the first filling material 3 between the connection members 11 is pushed out toward the connection members 11. In contrast, since the hardness of the first filling material 3 in the vicinity of the connection member 11 is higher, the first filling material 3 in the vicinity of the connection member 11 is hardly deformed even by being pressed by the elastic body 21. Accordingly, the area X is curved from the back surface side toward to the light-receiving surface side by being pressed by the elastic body 21.

Alternatively, the waveform shape illustrated in FIG. 9 can be formed by making the temperature T5 of the second filling material 5 in the vicinity of the connection member 11 higher than those of the other parts, as illustrated in the lower side in FIG. 9(b). The higher temperature T5 can be achieved by incorporating the plurality of heaters which extend along the second direction to positions corresponding to the respective connection members 11 of the elastic body 21. At that time, the hardness of the first filling material 3 is adjusted to be higher than the hardness of the second filling material 5 in the vicinity of the connection member 11.

The pressure molding is performed in such state. The second filling material 5 in the vicinity of the connection member 11 is pushed out toward the space between the connection members 11. In contrast, the second filling material 5 between the connection members 11 is hardly deformed. Thus, the area in the vicinity of the connection member 11 of the solar cell 10 is curved from the back surface side toward the light-receiving surface side.

To form the waveform shape illustrated in FIG. 10, the temperature T3 of the first filling material 3 in the vicinity of the connection member 11 is made higher than those of the other parts, or the temperature T5 of the second filling material 5 between the adjacent connection members 11 is made higher than those of the other parts. Accordingly, the waveform shape in FIG. 10 can be formed for the same reason as in FIG. 9.

As described above, in the solar cell 10 of the solar cell module 1, at least at the end in the second direction, the end cross-section along the first direction has a waveform shape. Accordingly, when the solar cell 10 is deformed in conformity with the curved shape of the first protective member 2, the waveform shape can absorb stress generated by the deformation. Therefore, cracking of the solar cell 10 can be suppressed.

In the adjacent solar cells 10A and 10B of the solar cell module 1, if, at the end of the solar cell 10A facing the solar cell 10B, the end cross-section at the position where the connection member 11 is arranged has a peak of the waveform shape, at the end of the solar cell 10B facing the solar cell 10A, the end cross-section at the position where the connection member 11 is arranged has a valley of the waveform shape. Accordingly, deformation of the connection member 11 extending from the back surface side of the solar cell 10A to the light-receiving surface of the solar cell 10B can be made small. An unnecessary stress can be prevented from being applied to the connection member 11. Therefore, the reliability of the solar cell module 1 is further improved.

(Modification)

In the embodiment, the solar cell module to be mounted on a vehicle is described. However, the present invention is not limited thereto and may be preferably applied to solar cell modules having a curved surface with a prescribed radius of curvature set at least in one direction.

In the embodiment, the first protective member 2 at the light-receiving surface side has a curved surface, and the other members are deformed in conformity with the shape of the first protective member 2. However, a protective member on a back surface side may have a curved surface and the other members may be deformed in conformity with the shape of the protective member on the back surface side.

In the present embodiment, the hardness of the first filling material 3 and the second filling material 5 is varied to form the waveform shape of the solar cell 10. However, the present invention is not limited thereto. For example, the waveform shape of the solar cell 10 may be formed by forming the waveform shapes of the first filling material 3 and the second filling material 5 in advance and causing the first filling material 3 and the second filling material 5 to press the solar cell 10.

INDUSTRIAL APPLICABILITY

The present invention can be applied to solar cell modules having a curved surface.

REFERENCE SIGNS LIST 1 solar cell module, 2 first protective member, 3 first filling material, 4 solar cell string, 5 second filling material, 6 second protective member, 10, 10A, 10B solar cell, 11 connection member, 12 photoelectric converter, 13 light-receiving surface collecting electrode, 14 back surface collecting electrode, 20 base, 21 elastic body, 22 frame, 23 decompressor, 40, 41, 43, 44 end cross-section

The invention claimed is:
1. A solar cell module comprising:
a first protective member having a curved surface with a prescribed radius of curvature set in at least a first direction;
a first filling material arranged upon the first protective member;
a plurality of solar cells arranged upon the first filling material, each of the solar cells including a photoelectric converter and a collecting electrode provided on the photoelectric converter;
a second filling material arranged upon the plurality of solar cells;
a second protective member arranged upon the second filling material; and
a connection member;
wherein the plurality of solar cells comprises a first solar cell and a second solar cell that are adjacent to each other;
the connection member is disposed between the first solar cell and the second solar cell in a second direction orthogonal to the first direction;
the connection member is connected, on a back-surface side, to the collecting electrode on a light-receiving surface side of the first solar cell;
the connection member is connected, on a front-surface side, to the collecting electrode on a back-surface side of the second solar cell to thereby electrically connect between the collecting electrode of the first solar cell and the collecting electrode of the second solar cell;

an end cross-section of each of the plurality of solar cells located at an end in the second direction and extending in the first direction has a waveform shape;

wherein the end of the first solar cell and the end of the second solar cell face each other; and at the ends where the first solar cell and the second solar cell face each other, the waveform shape of the end cross-section at a position where the connection member is connected to the first solar cell is a valley, and the waveform shape of the end cross-section at a position where the connection member is connected to the second solar cell is a peak.

2. The solar cell module according to claim 1, wherein each of the solar cells is curved in conformity with the curved surface of the first protective member.

3. The solar cell module according to claim 1, wherein the first protective member also has a prescribed radius of curvature in the second direction, and the radius of curvature in the first direction is smaller than the radius of curvature in the second direction.

* * * * *